(12) United States Patent
Ibnabdeljalil et al.

(10) Patent No.: US 6,365,958 B1
(45) Date of Patent: *Apr. 2, 2002

(54) SACRIFICIAL STRUCTURES FOR ARRESTING INSULATOR CRACKS IN SEMICONDUCTOR DEVICES

(75) Inventors: M'Hamed Ibnabdeljalil, Dallas; Darvin R. Edwards, Garland; Gregory B. Hotchkiss, Richardson, all of TX (US)

(73) Assignee: Texas Instruments Incorporated, Dallas, TX (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/235,009

(22) Filed: Jan. 21, 1999

(51) Int. Cl.$^7$ ............................................. H01L 23/544
(52) U.S. Cl. ........................ 257/620; 257/619; 438/462
(58) Field of Search ................... 257/620, 618, 257/619, 767, 797; 438/462, 637, 401

(56) References Cited

U.S. PATENT DOCUMENTS 5,530,280 A * 6/1996 White ........................ 257/508
5,763,936 A * 6/1998 Yamaha et al. ............. 257/644
5,831,330 A * 11/1998 Chang ........................ 257/620
5,834,829 A * 11/1998 Dinkel et al. ............... 257/620
6,111,419 A * 11/1998 Lefever et al. ............. 324/754
5,936,260 A * 8/1999 Corbett et al. ................ 257/48

FOREIGN PATENT DOCUMENTS

JP         9-199588         *  7/1997

* cited by examiner

Primary Examiner—Phat X. Cao
(74) Attorney, Agent, or Firm—Gary C. Honeycutt; Fred Telecky; Arthur I. Navarro

(57) ABSTRACT

A semiconductor wafer is disclosed comprising a substrate having a surface carrying an array of integrated circuit chips bordered by dicing lines; at least two sets of substantially parallel structures within each of said dicing lines, each set extending along the edge of a chip on opposite sides of each dicing line, respectively; each of said sets comprising at least one continuous barrier wall adjacent each chip, respectively, and a sacrificial composite structure in combination therewith, between said wall and the center of the dicing line, said composite structure including means of dispersing the energy associated with crack propagation, whereby any crack having sufficient energy to penetrate the composite structure will be transformed into a plurality of weaker cracks, non of which will be capable of penetrating said wall.

1 Claim, 5 Drawing Sheets

SACRIFICIAL STRUCTURES FOR ARRESTING INSULATOR CRACKS IN SEMICONDUCTOR DEVICES

The present invention relates generally to semiconductor circuit devices and in particular to the fabrication of semiconductor circuit chips protected against potential damage sometimes caused by the propagation of cracks initiated by the step of separating semiconductor wafers into individual chips.

BACKGROUND OF THE INVENTION

With most semiconductor products, for example integrated circuits, transistors and diodes, a large number of elements are manufactured simultaneously on a large semiconductor wafer of silicon, gallium arsenide, gallium phosphide etc. The semiconductor industry employs the terms "dicing technologies" or "scribing technologies" to refer to those techniques for obtaining a large number of functional chips, or dies, from each semiconductor wafer, Two dicing methods are particularly well known in the art: The grinding-cutting method, using a blade or wire saw, and the scribing method, using a diamond point. Modern silicon technology prefers the cutting method using high-speed rotating blades. When laying out the pattern of circuit chips, or dies, on the surface of the semiconductor wafer, manufacturing efficiency requires to minimize the distance between adjacent circuit chips so that the number of obtainable chips, this means the production yield, can be maximized.

The technology of dicing has been developed to a high standard. In U.S. Pat. No. 4,610,079 of Sep. 9, 1986 (Abe et al., "Method of Dicing a Semiconductor Wafer") it has been pointed out that three restrictions exist with respect to the minimum distance permissible between adjacent chips. The first restriction is the actual dicing width, the second restriction is the degree of precision to which the cutting machine can be adjusted, and the third restriction is the cracks and chip-outs extending extending laterally from the dicing line into the semiconductor and insulating materials. Even today, the third of these restrictions, namely the generation of cracks, creates the most significant limitation with respect to minimizing the distance between adjacent circuit chips. In addition, those cracks represent significant reliability risks, since they tend to grow and widen under thermal and mechanical stress and thus eventually imperil the functionality of the integrated circuit.

Several solutions have been proposed to solve some of these technical problems associated with the manufacture and dicing of semiconductor wafers. The sealing of dicing streets against penetration of mobile ions with the help of metal edge barriers overlapping insulating layers was proposed in U.S. Pat. No. 4,364.078 of December 1982 (Smith et al., "Edge Barrier of Polysilicon and Metal for Integrated Circuit Chips") and U.S. Pat. No. 4,656.055 of April 1987 (Dwyer, "Double Level Metal Edge Seal for a Semiconductor Device"). These structures proved ineffective against cracks when insulators extend into the dicing lines and are subject to cracks during the dicing process. In U.S. Pat. No. 5,024,970 of June 1991 (Mori, "Method of Obtaining Semiconductor Chips"), small grooves are obtained in the insulating zone by plasma etching. Many cracks originating from the dicing process are seen to stop at these grooves, but not all of them.

Forming consecutive grooves of different widths by using diamond and resin blades has been described in U.S. Pat. No. 5,266,528 of November 1993 (Yamada et al., "Method od Dicing Semiconductor Wafer with Diamond and Resin Blades"). Dicing line features to limit the spreading of cracks and chip-outs generated during dicing have been proposed in U.S. Pat. No. 4,610,079 of September 1986, mentioned above. Avoiding residues of layers of non-uniform thicknesses, or the generation of lose particles, has been described in U.S. Pat. No. 5,136,354 of August 1992 (Niorita et al., "Semiconductor Device Wafer with Interlayer Insulating Film Covering the Scribe Lines") with added division in U.S. Pat. No. 5,237,199 of August 1993. In these patents, the etching of slit grooves in passivation films is described in order to stop cracks in the passivation layers during the dicing process.

The latter ideas were continued and elaborated in U.S. Pat. No. 5,414,297 of May 1995 (Mtorita et al., "Semiconductor Device Chip with Interlayer Insulating Film Covering the Scribe Lines"). In particular, it is described how the processes used in forming the conductive interconnections between elements of the integrated circuit can be exploited to generate one vertical metal line parallel to the dicing lines so that it extends around the entire periphery of each integrated circuit chip.

Practical semiconductor manufacturing has demonstrated, however, that these structures do not stop severe cracks originating in the dicing process. On the contrary, thermo-mechanical stresses generated by modern device applications, board attach processes, or rigorous environmental testing procedures may convey enough energy to many cracks so that they will eventually bypass obstacles or break through a single seal. Following these cracks, moisture and contamination are free to penetrate active circuitry and to start degrading the electrical device performance drastically.

In summary, the goal of providing a technology for dicing semiconductor wafers with assured protection against mechanical and environmental damages and thus offering for the commercial and military markets cost-effective and reliable semiconductor products, manufactured in high volume and with flexible, low-cost design and production methods, has remained elusive, until now.

SUMMARY OF THE INVENTION

According to the Griffith energy-balance concept for crack formation in brittle solids (first published in 1920), a change in the length of a nascent crack or notch cannot change the sum of all energies; in other words, the sum of surface energy and mechanical energy has to stay constant. This means for a crack extension that the surface energy may generally increase, but the mechanical energy has to decrease. The mechanical energy itself consists of the sum of the strain potential energy stored in the material and the potential energy of the outer applied loading system. This says, whenever any of these energies can assume a lower value, the freed energy can be invested in generating more surface for an expanding crack.

Applying the Griffith equilibrium requirement to semiconductor devices, whenever uniform stress is applied (for instance during operation or testing of the semiconductor device) so that it is larger than the failure stress, a nascent crack may propagate spontaneously and without limit—unless it is stopped or arrested. The failure stress at the crack front, in turn, is proportional to the free surface energy per unit area and to Young's modulus (a material constant), and inverse proportional to the length of the starter crack or notch. Since dicing streets are well-known areas for the generation of microcracks, they are prime concerns for latent failures of the semiconductor device due to propagating cracks.

The present invention comprises sacrificial structures for arresting insulator cracks in semiconductor circuit chips and methods for fabricating reinforced insulators in semiconductor wafers. It has particular application to dicing multi-level metal semiconductor wafers into individual circuit chips. The invention permits the introduction of electrically advantageous, but mechanically brittle insulators into the production of large-area, high-speed integrated circuits without risking reliability degradation through propagating cracks initiated by the dicing process.

Based on the invention, the fabrication of more than one metallic sacrificial structure transforms the brittle insulator areas around each circuit chip into reinforced composites with considerable toughness against fracture and propagation of nascent cracks. The main contribution to this toughness comes from the intrinsic adhesion energies of the components. The toughening is attributable to shielding processes, notably bridging, where the reinforcing phases are left intact as ligaments at the crack interface. Key to attaining effective toughening is the existence of suitably weak interfaces to allow debonding between the insulators and the reinforcing metal structures, and energy dissipation within the ensuing bridges at separation. Even without optimizing the shielding proceses, large increases in peak stress and strain to failure have been observed, with the crack resistance energy per unit area increasing up to an order of magnitude.

If a crack were able to penetrate the first seal structure by breaking through a weak flaw, or due to rupturing of the metal seal structure, it would loose its energy in debonding due to the reinforced composite properties of the insulating area, and would be arrested by the next seal structure. With these structures, the brittle oxides can preserve their stiffness, but the metal structures enhance toughness and energy absorption capacity (illustrated by A. G. Evans. "Perspective on the development of high-toughness ceramics", J. Amer. Ceram. Soc., vol. 73, p. 187, 1990). If no full-scale plastic zone develops about the crack tip, the shielding is predominantly associated with dissioation of plastic energy at the metal across the crack interface.

It is an object of the present invention to securely arrest any cracks originating from chip-outs caused by the rotating dicing blades.

Another object of the present invention to provide reliability assurance for the finished product against mechanical stresses by introducing structural reinforcement of inter-metal dielectrics, which also double as sealing barriers against migrating chemical impurities.

Another object of the present invention is to provide reliability assurance for the finished product by changing the failure mechanism from a probabilistic weakest-link mode to a parallel-type mode, effectively eliminating the failure mechnism. This built-in reliability assurance can be applied for several future generations of products.

Another object of the present invention is to apply electrical bias to at least some of the structures such as to arrest the drift of unwanted charged particles.

Another object of the present invention is to introduce a multitude of sacrificial structures such that they can be produced along with the integrated circuits without needing extra space or adding extra manufacturing cost.

These objects have been achieved by the design and mass production process of the sacrificial structures of the invention. Various modifications have been successfully employed for integrated circuits of different design rules and hierarchies of metal/insulator sandwiches.

In one embodiment of the invention, metal-filled via grooves are positioned on top of each other, forming a continuous "wall" of metal, which transsects the layers of insulating films disposed on top of each other. Such metal walls extend all around the periphery of the circuit chip and represent a sacrificial structure for protecting the chip circuitry. At least two of these structures are arranged in series such that they are substantially parallel to each other and to the dicing line. For an insulator crack, originating at the dicing line and driven to propagate into the circuit chip towards the integrated circuitry, a series of at least two sacrificial structures arrests further propagation by changing, the failure mechanism from a probabilistic weakest-link mode to a parallel-type mode.

In another embodiment of the invention, at least one of the sacrificial structures is in electrical contact with a highly doped region of the semiconductor wafer. Electrical potential, such as ground potential, can thus be applied to the sacrificial structure, effectively stopping the drift of unwanted charged particles.

In another embodiment of the invention, at least two grids of intersecting metal lines are formed, disposed on top of each other and connected by metal-filled vias. The sacrificial structures form a three-dimensional network of metal distributed in brittle oxides. With the mesh size of this metal net determined by the thicknesses of the interlayer insulation films, the composite is reinforced and any insulator crack is arrested by absorbing its energy in debonding, or delamination work.

In another embodiment of the invention, combinations of sacrificial structures are arrayed so that they maximize the arrest of cracks and charged impurities. The integrated circuit of each chip is surrounded by at least two continuous walls of metal transsecting the brittle oxides; at least one of these walls may be in electrical contact with a highly doped region of the semiconductor wafer. Next, a three-dimensional network of metallic structures is layed out next to the dicing streets, surrounding each chip from all sides. A rare crack which is not arrested by this web, has lost so much of its energy in it that it cannot break through the wall of metal.

The technical advances represented by the invention, as well as the objects thereof, will become apparent from the following description of the preferred embodiments of the invention, when considered in conjunction with the accompanying drawings and the novel features set forth in the appended claims:

BRIEF DESCRIPTION OF THE DRAWINGS

FIG. 1A is a simplified and schematic top view of the intersection of two dicing lines between the corners of four circuit chips.

FIG. 1B is a simplified and schematic cross section through the surface of a wafer showing a dicing line and part of two adjacent circuit chips.

FIG. 2A is a simplified and schematic top view of the intersection of two dicing lines between the corners of four circuit chips.

FIG. 2B is a simplified and schematic cross section through the surface of a wafer showing a dicing line and adjacent combinations of embodiments of the invention.

FIG. 7A is a simplified and schematic top view of the intersection of two dicing lines between the corners of four circuit chips.

FIGS. 7B and 7C are simplified and schematic cross sections through the surface of a wafer showing a dicing line and adjacent combinations of embodiments of the invention.

DETAILED DESCRIPTION OF THE PREFERRED EMBODIMENTS

The present invention is related to large semiconductor chips containing high-speed integrated circuits. The electrical elements of the circuits are fabricated within the chosen semiconductor material, while a plurality of alternating metal layers and insulator layers stacked on top of the semiconductor surface serves as the network interconnecting the individual circuit elements. A multitude of chips are fabricated simultaneously on each large-diameter wafer of semiconductor substrate material; after completion of the fabrication process, they have to be separated from each other in a process or singulation step termed "dicing". Typically, rapidly rotating blades are used as saws for this dicing process, generating "dicing lines" or "dicing streets" in the process. Commonly, blades are made of steel or titanium alloys with fine grain-size diamond dust at the cutting perimeter. Usually, these dicing streets cut completely through the thickness of the semiconductor wafer, and in the process generate a "longitudinal edge" on each side of each dicing cut. By the nature of the dicing operation, the two longitudinal edges generated by each dicing cut are parallel to each other. The semiconductor chips thus fabricated by the dicing process have a periphery of straight lines at right angles, forming rectangular or square shaped chip areas.

The semiconductor materials, usually silicon, gallium arsenide or other III–V compounds, are brittle. The insulators, especially those needed for high-speed integrated circuits, typically consist of plasma-deposited oxide or spun-on glass; all of them are brittle. Often, these layers extend into and over the wafer areas, where the dicing will take place. The brittle nature of these materials makes it unavoidable that the rotating sawing blades leave ragged contours of microscopic chip-outs, or notches, on both sides of all dicing streets. Whenever it is energetically favorable, microcracks may initiate at these microscopically disturbed surfaces.

The present invention eliminates the propagation of nascent cracks, even in the extremely brittle insulators required for ultra-fast digital-signal processors (DSP) and microprocessors ($\mu$P). The present invention further meets the requirements for minimizing the sacrifice of semiconductor material for dicing. The present invention can be incorporated into circuit chips of any size, even the largest dynamic random-access memories (DRAM), static random-access memories (SRAM), erasable programmable read-only memories (EPROM), and logic circuits (LOGIC).

Figure 1A:
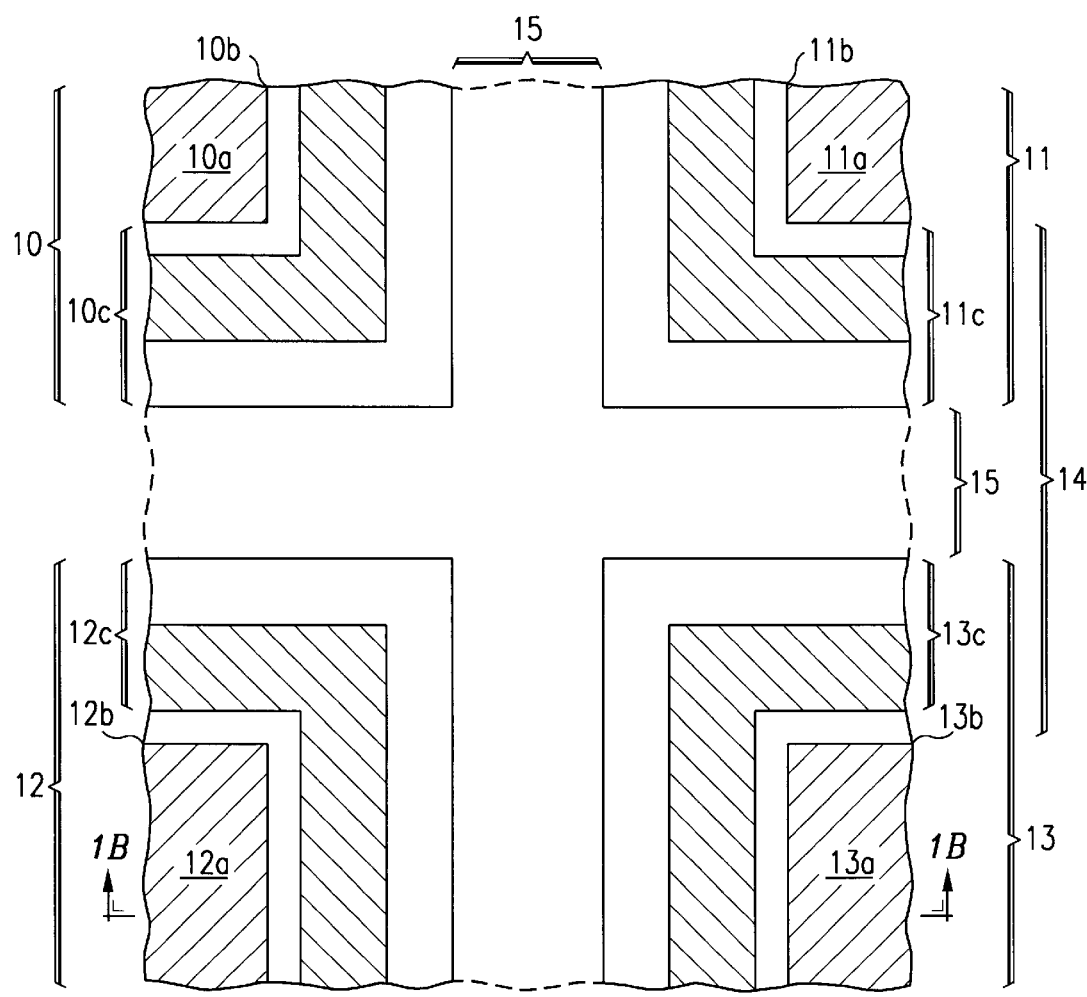
FIGS. 1A and 1B refer to prior art.

The impact of the present invention can be most easily appreciated by highlighting the shortcomings of the known technology. FIG. 1 shows a crack originating from the dicing street between circuit chips and propagating in the direction towards the integrated circuitry; it also illustrates the method which known technology is using in order to arrest the crack by a sea. FIG. 1A is a schematic top view of the corners of four chips 10, 11, 12, and 13. They are separated by, and symmetrically positioned around two intersecting dicing streets 15 of identical widths (since they were generated by the same sawing blade), which intersect at right angles. Within each circuit chip, the actual integrated circuit area is schematically shown and indicated by reference numbers comprising "a" (10a, 11a, etc.). The respective integrated circuit area terminates at the respective chip data edge denoted by reference numbers comprising "b" (10b, 11b, etc.). The distance between adjacent chip date edges is denoted by reference number 14. Between the chip data edge and the dicing street is an area of each chip, denoted by reference numbers comprising "c", which contains structures intended for protecting the integrated circuit from propagating cracks and impurities. For this area 10c, 11c, etc., of each respective chip, the term "seal areas" will be used.

Figure 1B:
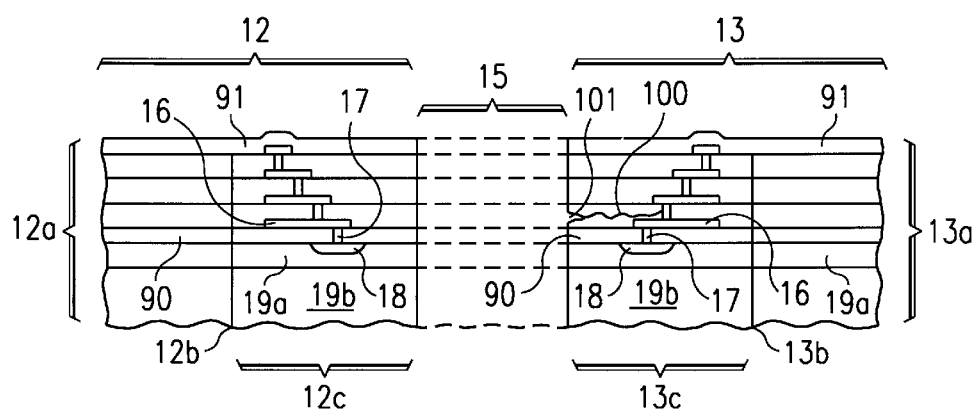

FIG. 1B is a schematic cross section through circuit chips 12 and 13 and the dicing street 15 between them. FIG. 1B also shows the cross section through seal areas 12c and 13c, with a typical seal structure positioned in each. Such seal structure consists of a plurality of patterned metal layers 16, positioned on top of each other and mutually connected by metal-filled via grooves 17. The via groove closest to the semiconductor substrate is in electrical contact with a heavily doped region 18 of the semiconductor substrate (sometimes referred to as the "moat"). The substrate itself often comprises a lowly doped epitaxial layer 19a on top of a more a heavily doped starting material 19b.

A crack 100 is schematically indicated in circuit chip 13 of FIG. 1B, originating at a dicing street notch 101 and irregularly growing into the brittle insulator. It will be discussed later what will happen to the crack when it reaches the metal (a layer 16 or a via 17) of the single seal structure, and why it can quite often break through a single seal structure.

The seal structures are manufactured step by step as sequential depositions of insulators and metals in conjunction together with the fabrication of the integrated circuit elements. First, a moat is diffused into the epitaxial semiconductor material in a process needed otherwise for fabricating strongly doped surface regions in some circuit elements. This low-resistance moat serves as an anchor for the seal structure to be built, and permits the application of specific electrical potentials to the seal structure, such as ground potential or Vss.

Next, a film 90 of brittle insulator is deposited over the wafer. In FIG. 1B, this includes the areas 12c and 13c between the circuit chips and the dicing street 15. A via groove 17 is plasma-etched into interlayer insulation film 90 and filled with metal.

Next, a layer 16 of metal is deposited and etched into a pattern so that it extends over a region of interlayer insulation film 90 adjacent to each via groove.

The sequence of these process steps is repeated several times, as often as there are metal layer fabrication steps of the intergrated circuit. Another interlayer insulation film 90 is deposited. Another via groove 17 is plasma-etched into this new interlayer insulation film 90 and filled with metal. Another layer 16 of metal is deposited and etched into a pattern overlapping the via grooves. This new pattern may differ from the earlier one by leaving an area for the metal somewhat smaller than the earlier one. In this fashion, a "stairstep" configuration for the overall seal structure is generated, which relaxes photomask alignment rules. Unfortunately, this stair-step configuration is wide and consumes too much precious semiconductor area.

Finally, a protective overcoat 91 is deposited over the whole wafer.

Experience has shown that while a single dicing line seal structure (maybe in stairstep configuration) as decribed in FIG. 1A and 1B, which surrounds the circuit area, may indeed stop some cracks originating from notches at the dicing street, it is by no means sufficient for stopping all cracks, in particular those developing in the more brittle insulator layers required today by the emerging ultra-fast integrated circuits. The reason is basically that cracks, when implied with enough energy, are able to migrate until they find the weakest link in the seal structure. The failure mechanism is, therefore, controlled by the probability that a nascent crack will find the weakest link. In addition, it has been experienced that migrating impurities are often not stopped by a single seal, so that mobile ions may diffuse right through.

The present invention avoids these difficulties by changing the failure mechanism from a probabilistic weakest-link mode to a parallel-type mode. Although the invention will be described in FIGS. 2A and 2B using a combination of three dicing line seals as a particular embodiment, it should be understood by one skilled in the art that the principles of the present invention are applicable to different combinations. Furthermore, the integrated circuit wafer may be made of silicon, gallium arsenide, or any other semiconductor material customarily used in electronic device production.

Figure 2A:
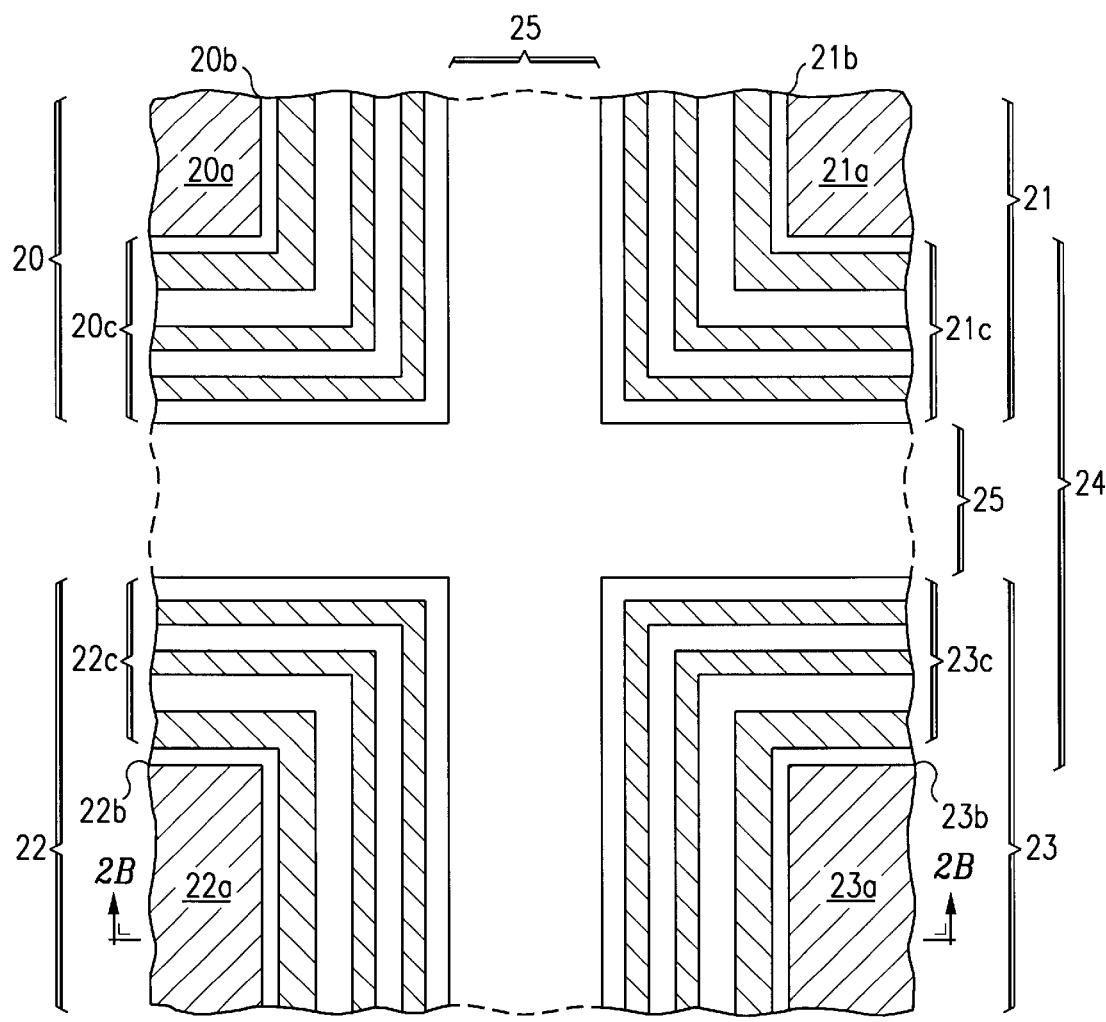
FIGS. 2A and 2B show the same part of a wafer after embodiments of the invention have been incorporated.

FIG. 2A is a schematic top view of the corners of four chips 20, 21, 22, and 23. They are separated by, and symmetrically positioned around two intersecting dicing streets 25 of identical widths (typically 70 to 80 $\mu$m; they were generated by the same sawing blade), which intersect at right angles. Within each circuit chip, the actual integrated circuit area is schematically shown and indicated by reference numbers comprising "a" (20a, 21a, etc.). The respective integrated circuit area terminates at the respective chip data edge denoted by reference numbers comprising "b" (20b, 21b, etc.). The distance between adjacent chip data edges is denoted by reference number 24; it is typically between 140 and 160 $\mu$m wide. Between the chip data edge and the dicing street is an area of each chip, denoted by reference numbers comprising "c", which contains structures according to the present invention for protecting the integrated circuit from propagating cracks and impurities. For this area 20c, 21c, etc., of each respective chip, the term "seal area" will be used. The widths of each seal area is usually chosen in the 30 to 45 $\mu$m range.

Figure 2B:
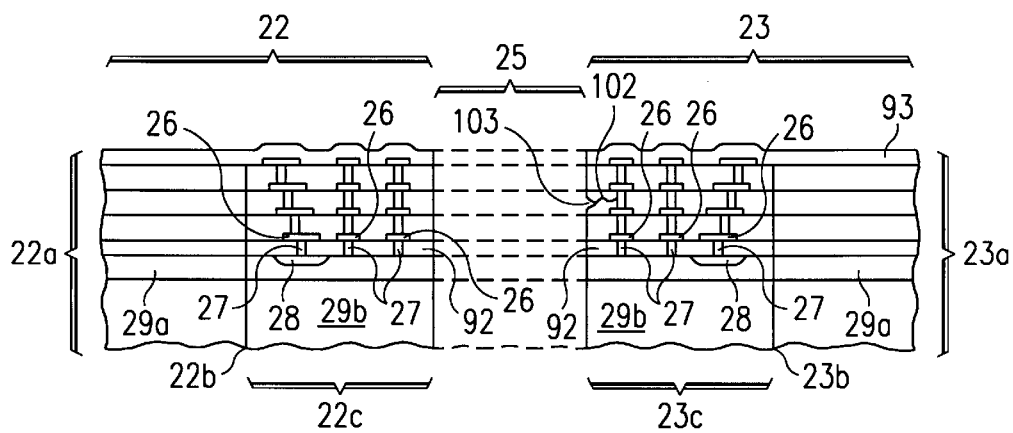

FIG. 2B is a schematic cross section through circuit chips 22 and 23 and the dicing street 25 between them. FIG. 2B also shows the cross section through seal areas 22c and 23c, with an embodiment of the invention positioned in each. The embodiment comprises a plurality of individual seal structures, each one consisting of a multitude of patterned metal layers 26, positioned on top of each other and mutually connected by metal-filled via grooves 27. The via groove closest to the semiconductor substrate may be in electrical contact with a heavily doped region 28 of the semiconductor substrate (sometimes referred to as the "moat"). The substrate itself often comprises a lowly doped epitaxial layer 29a on top of a more heavily doped starting material 29b.

The seal structures arc manufactured as a group step by step as sequential depositions of insulators and metals together with the fabrication of the integrated circuit elements. First, a moat is diffused into the epitaxial semiconductor material in a process needed otherwise for fabricating strongly doped surface regions in some circuit elements. This low-resistance moat serves as an anchor for the seal structure to be built, and permits the application of specific electrical potentials to the seal structure, such as ground potential or Vss. It falls within the scope of the invention that either one, or more, or all, or none of the seal structures are anchored into respective moats. In another embodiment, all moats are coherent and fabricated by the same diffusion process.

Next, a film 92 of plasma-deposited oxide, or spun-on glass, or a combination thereof, is deposited over the wafer. In FIG. 2B, this includes the areas 22c and 23c between the circuit chips and the dicing street 25. Via grooves 27 (sometimes more than one for each seal structure) are plasma-etched into interlayer insulation film 92 and filled with metal (for instance, tungsten, copper, aluminum, or others).

Next, a layer 26 of metal (for example, aluminum or aluminum-copper alloy, or copper) is deposited and etched into a pattern so that it extends over a region of interlayer insulation film 92 adjacent to each via groove. The width of the metal layer 26 is larger than the width of via groove 27, but is may be a different width for each seal structure. The width is usually selected in the 4 to 20 $\mu$m range.

The sequence of these process steps is repeated several times, as often as there are metal layer fabrication steps of the integrated circuit. In the example illustrated in FIG. 2B, there are four metal layers 26 in each seal structure, and consequently also four via grooves 27 in each seal structure. The width of each patterned metal layer may vary from layer to layer, and also from seal structure to seal structure. Neither the via grooves nor the patterned metal layers have to be aligned exactly on top of each other; they may often have an offset alignment resulting in a stairstep configuration when viewed in cross section. Between seal structures may be a pitch varying from 10 to 40 $\mu$m.

Finally, a protective overcoat layer 93, such as silicon nitride, is deposited over the whole wafer.

A crack 102 is schematically indicated in circuit chip 23 of FIG. 2B, originating at a dicing street notch 103 and irregularly rowing into the brittle insulator. The deposited oxides and glasses are generally very brittle. However, based on the invention, the fabrication of more than one metallic seal structure transforms these brittle insulator areas around each circuit chip into reinforced composites with considerable toughness against fracture and propagation of nascent cracks. From this protecting property, the name "sacrificial structure" has been derived.

Figure 3:
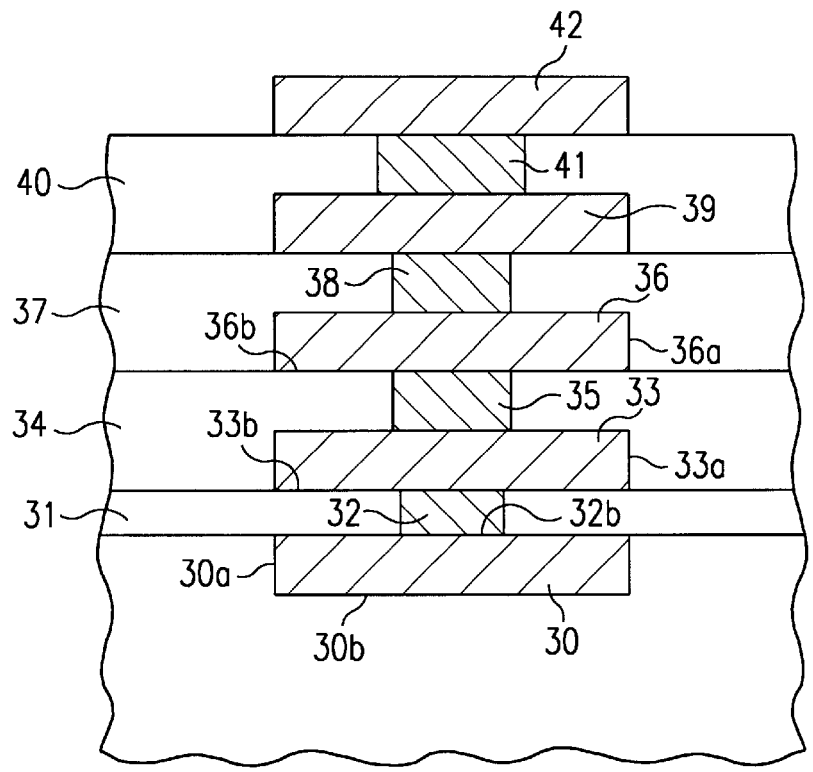
FIG. 3 depicts one variation of an embodiment of the invention.
Figure 4:
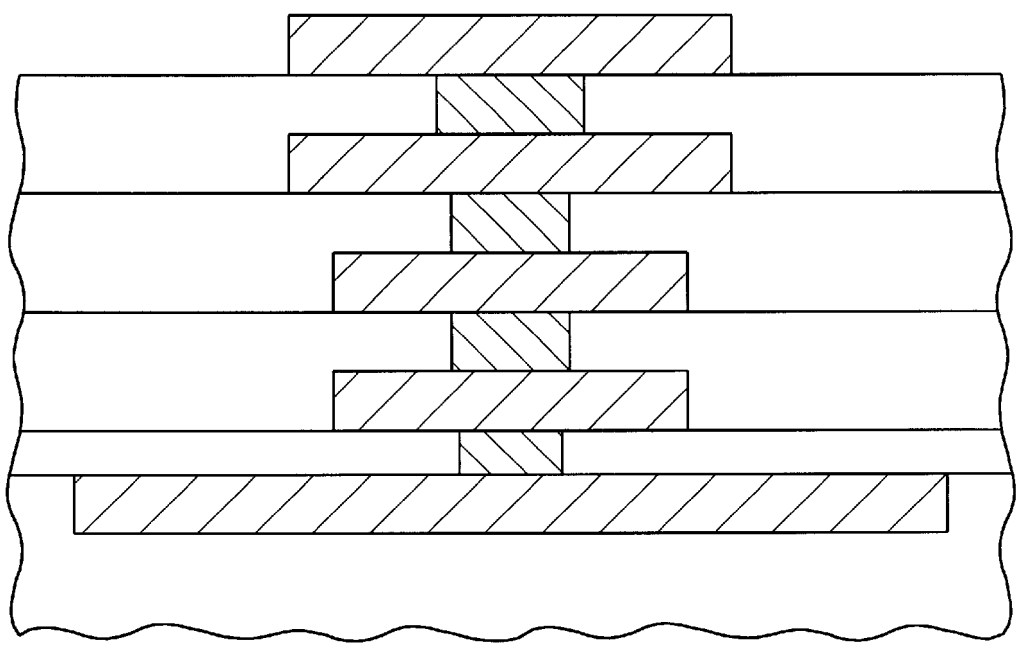
FIG. 4 depicts another variation of the same embodiment of the invention.

The sacrificial structures of the present invention may take a multitude of different shapes, as determined by circuit design rules and number and nature of process steps. As examples, FIGS. 3 and 4 are schematic representations, shown in cross section, of two embodiments of seal structures with four levels of metallization, as used by the invention. In FIG. 3, a heavily doped moat 30 is diffused into lowly doped epitaxial silicon. The depth 30a of the diffusion typically has a range of 0.2 to 1.0 $\mu$m. The width 30b commonly has a range from 3 to 7 $\mu$m, with a preferred width of 5 $\mu$m. It may be square shaped, but could also be shaped as a long trench. The interlayer insulation film 31 is made of plasma-deposited oxide or spun-on glass, or a combination thereof: it can also comprise polymers such as pre-cured polyimides or epoxies. Its thickness typically ranges from 0.5 to 1.0 μm, with a preferred thickness of 0.8 μm.

Via 32 commonly has a width 32b in the range of 0.4 to 0.8 μm. Its area may be shaped as a square, or as a rectangle, or as a groove all around the circuit chip perimeter. After it has been sputter-etched into the oxide 31, until it has reached the moat, it is filled with metal (for example, tungsten, copper, aluminum, or alloys). In contact with the via metal is the first metal layer, indicated by reference number 33 in FIG. 3. It usually has a thickness 33a in the range of 0.5 to 1.0 μm, with a preferred thickness of 0.8 μm. While layer 33 may comprise aluminum, copper or aluminum-copper alloy, it may in addition comprise sandwiches of layers made of refractory metals such as tungsten, titanium, molybdenum, or alloys or compunds, such as nitrides, of these metals. Metal layer 33 is patterned by etching to obtain a width in the range of 1 to 5 μm. It may extend all around the circuit chip perimeter, or it may have a more restricted geometry.

Interlayer insulation film 34 has a composition and thickness similar to film 31. Its spin-on process generates a flat surface, smoothening over the step generated by the first metal layer 33. Into this insulator film, another via 35 is etched down to metal layer 33. Via 35 may be aligned on top of via 32 or it may be offset, and it has typically the same thickness as via 32. Its width may be the same as via 32, or it may be different; in the embodiment of FIG. 3, via 35 is shown with a larger width than via 32. The area of via 35 may have the shape of a square, a rectangle or a groove extending all around the perimeter of the circuit chip. It is filled with the same metal as via 32.

The second metal layer 36 is similar in its deposition process, metallic composition and thickness 36a to the first metal layer 33. Its patterning may generate a width 36b similiar to width 33a of the first metal layer, or it may obtain a different width.

The fabrication process and its variations are repeated for interlayer insulation film 37, via 38 opening and metal filling, third metal layer 39, interlayer insulation film 40, via 41 opening and metal filling, and fourth metal layer 42. As mentioned for the earlier process steps, the alignment of the new features relative to the previous ones is not critical, and the widths of the features may vary as deemed desirable from a design rule standpoint.

This flexibility of the embodiments of the invention is emphasized in FIG. 4. While as schematic as FIG. 3, FIG. 4 depicts a seal structure similar to the one in FIG. 3 relative to the number of metal-filled vias and metal layers, but the widths of the vias, the metal layers and the moat are designed different from each other. In addition, it should be pointed out that the moat is not essential for the shielding and crack-stopping ablility of the seal structure and the re-inforcing and toughening of the brittle oxides; the moat simply permits the application of electrical bias to the metal structure, such as ground potential and Vss. This property helps in stopping the drift of charged impurities such as unwanted ions.

Figure 5:
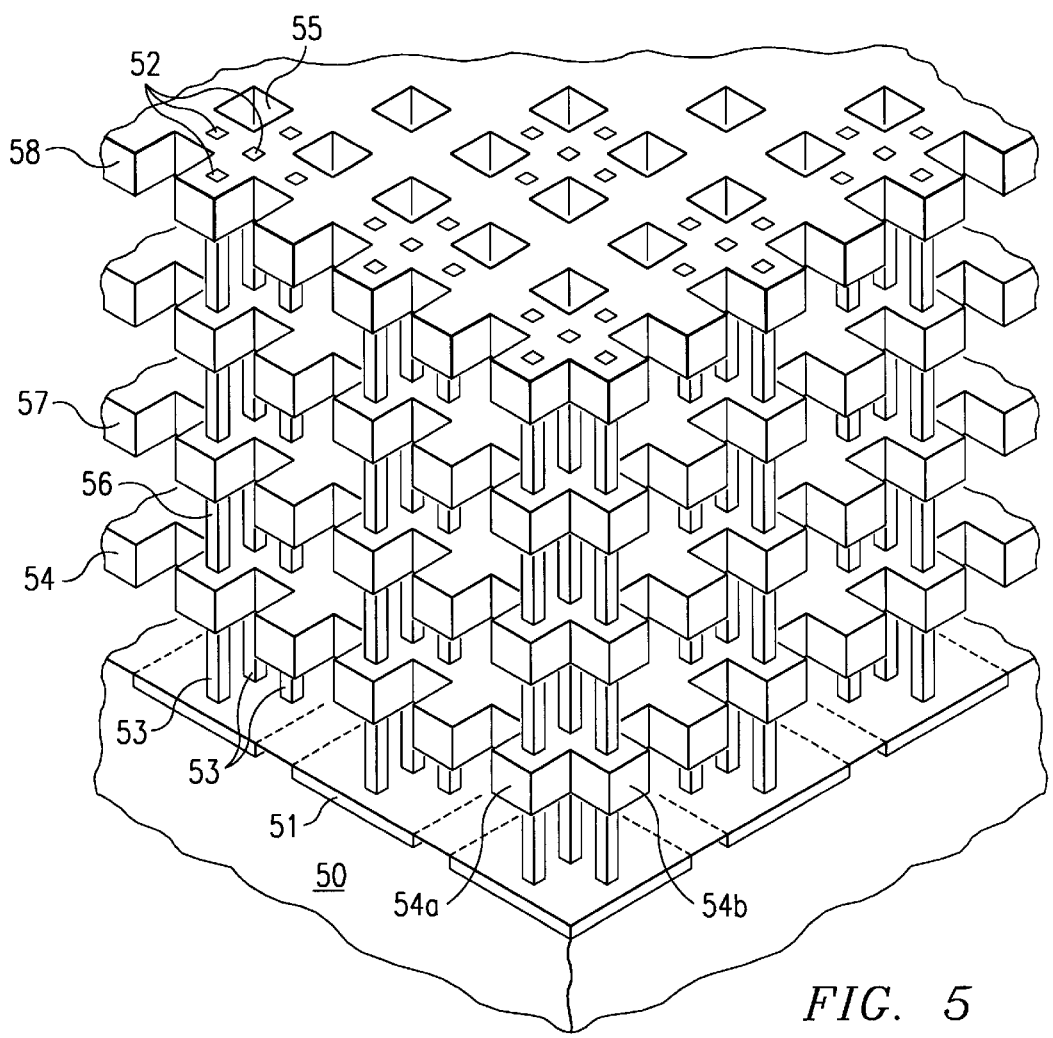
FIG. 5 is a simplified perspective view of part of another embodiment of the invention.

Another embodiment of the present invention is depicted in FIG. 5 in simplified manner. This embodiment comprises three-dimensionial reinforcing and shielding structures, which may be referred to as the "cross hatch pattern" of sacrificial structures. FIG. 5 shows a version of the metallic cross hatch pattern, but does not show the layers of oxides and glasses between the metal layers. Only a small portion of the pattern is shown; as a complete network, however, the sacrificial structures in cross hatch pattern generate a three-dimensional metallic network, or grid, in order to reinforce the brittle oxide and glass films such that the composite will arrest any crack by absorbing its energy in debonding or delamination "work".

The fabrication of the structures in FIG. 5 starts with diffusion of a pattern of moats 51 into epitaxial semiconductor 50. In other embodiments of the invention, this diffusion step may be omitted. The following film of insulating oxide or glass is not shown. A pattern of at least one via hole is sputter etched into this insulating film; for illustration only, the layout of several units of this pattern is indicated in FIG. 5 in the top metal layer by reference number 52. The number of vias is chosen by practical considerations of semiconductor circuit design. The vias are filled with metal (tungsten, copper, aluminum, or others) to generate contacs 53. These contacts connect the moats with the first metal layer 54, typically made of aluminum, copper, or aluminum/copper alloy. The thickness of this metal layer, as well as the lengths and widths of the contacts, are solely determined by practical circuit design rules and performance expectations. For instance, the widths of the vias may fall in the 0.5 to 1.5 μm range. Metal layer 54 is etched so that a grid of metal "strips" 54a and 54b is produced. As examples, the strips may be 1.0 to 2.5 μm wide and have a pitch of 5 to 15 μm. The windows which are thus opened between these strips, all the way down to the underlying interlayer insulator film, are later filled with insulating material, while the next oxide and/or glass film is deposited. For clarity, some of these windows are indicated in the top metal layer in FIG. 5 by reference number 55. Consecutive strips 54a form continuous metal lines, approximately parallel to each other, and consecutive strips 54b form continuous metal lines, parallel to each other. The two sets of parallel metal lines intersect each other at approximately right angles, and thus form a network of metal strips surrounding the perimeter of the integrated circuit chip.

The next insulator film is again not depicted in FIG. 5. As shown, it has the same thickness as the first one, but in other embodiments it may comprise different thickness and different material composition. Again, vias are etched open and then filled with metal, connecting the first metal layer 56 with the second metal layer 57. Vias 56 are shown in FIG. 5 comprising the same number and pattern as the first set of vias for the contacts to the moats, but they may be given different numbers and configurations in other embodiments. Metal layer 57 is shown to exhibit the same thickness and etched grid pattern as the first metal layer 54, resulting in a network of interconnected strips surrounding the perimeter of the circuit. For a person skilled in the art, different embodiments can easily be conceived.

The process of depositing insulator films, etching vias and filling them with metal, and depositing and patterning metal layers is repeated as often as the circuit fabrication process selected for the semiconductor wafer allows the repetition. In the example of FIG. 5, there are four metal layer deposition processes and thus four grid structures on top of each other. They are mutually connected by metal-filled vias, which, for this embodiment, appear in repetitive patterns. Since the fabrication of the network of cross hatch pattern structures completely follows the circuit manufacturing process, its fabrication adds no cost to that process. The top deposited metal layer 58 may be patterned as shown in FIG. 5, but it may also just be a flat unpatterned metal layer. The final protective overcoat, usually sputter-deposited silicon nitride, is not shown in FIG. 5. Other embodiments may employ polymer films, such as polyimide or expoxy.

Figure 6:
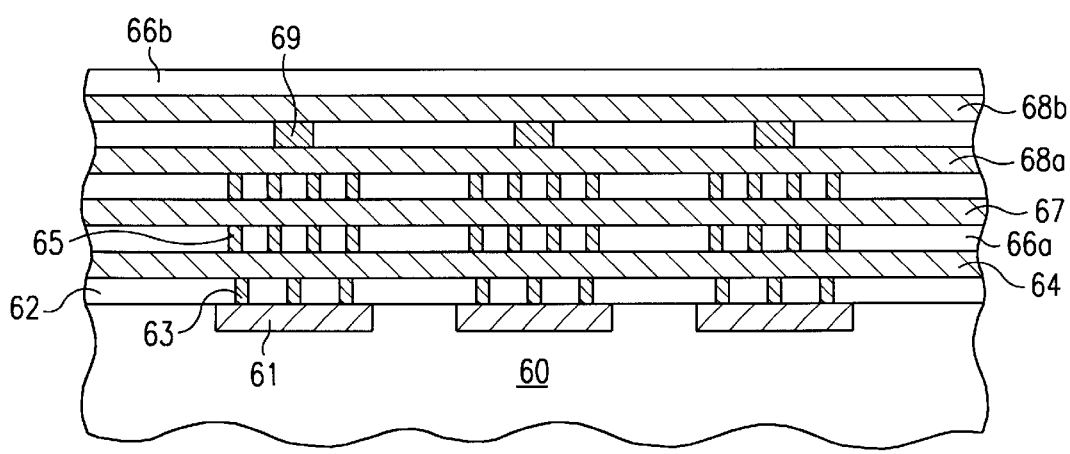
FIG. 6 is a simplified and schematic cross section of another embodiment of the invention.

Another embodiment of the invention is shown in the schematic cross section of FIG. 6. A sacrificial cross hatch structure with four layer metal layers is cut along a continuous metal grid line to show the arrangment of via connections. A plurality of heavily doped moats 61 is diffused in lowly doped epitaxial semiconductor 60. At least one metal-filled via 63 through interlayer insulator film 62 connects each moat with first metal layer 64. In interlayer insulator film 66a, a group of at least one metal-filled via 65, approximately aligned above each moat, is employed to connect metal layer 64 with the second metal layer 67. The same design and process are repeated to create the next vias and the next metal layer (reference number 68a). In a variation, at least one but wider metal-filled via 69, approximately aligned above the respective moats, is used to connect metal layer 68a with the next metal layer (reference number 68b). A final insulating layer 66b of protective overcoat (such as silicon nitride) conludes the design of the cross hatch pattern structures.

Figure 7A:
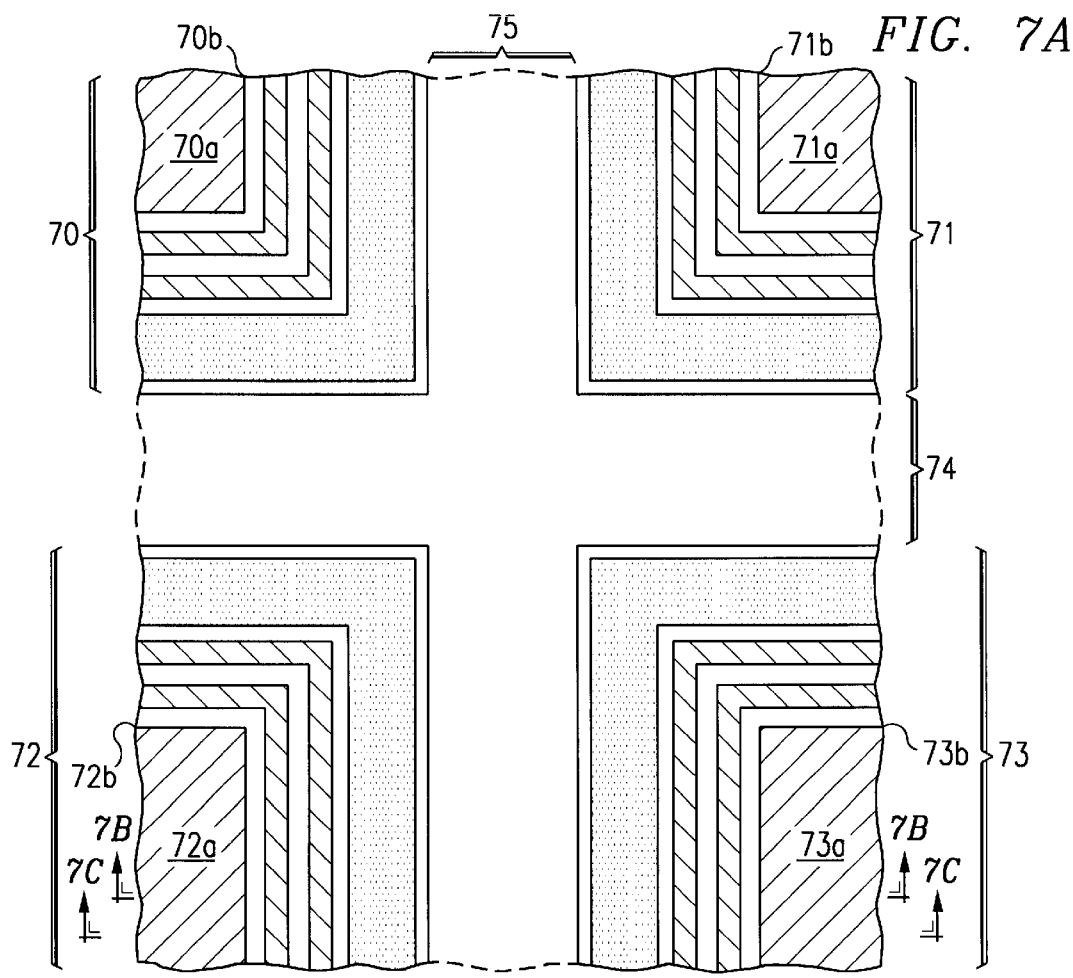
FIGS. 7A, 7B and 7C depict another embodiment of the invention.
Figure 7B:
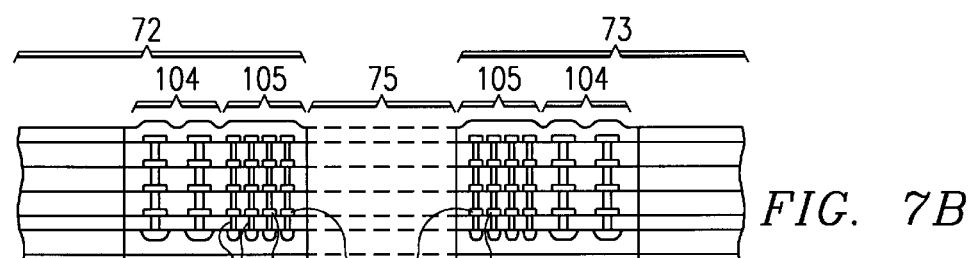
Figure 7C:
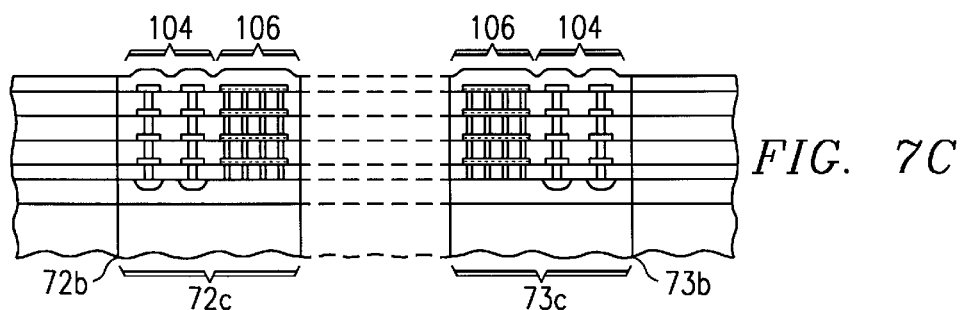

FIGS. 7A, 7B and 7C illustrate another embodiment of the present invention in simplified and schematic manner. The method of illustration is similar to FIGS. 2A and 2B. FIG. 7A is a schematic top view of the corners of four chips 70, 71, 72, and 73. They are separated by, and symmetrically positioned around two intersecting dicing streets 74 and 75. Within each circuit chip, the actual integrated circuit area is schematically shown and indicated by reference numbers comprising "a" (70a, 71a. etc.). The respective integrated circuit area terminates at the respective chip data edge denoted by reference numbers comprising "b" (70b, 71b, etc.). Between the chip data edge and the dicing street is an area of each chip, denoted by reference numbers comprising "c", which contains sacrificial structures according to the present invention for protecting the integrated circuit from propagating cracks and impurities. For this area 70c, 71c, etc., of each respective chip, the term "seal area" will be used.

FIGS. 7B and 7C are schematic cross sections through circuit chips 72 and 73 and the dicing street 75 between them. FIGS. 7B and 7C also show the cross sections through seal areas 72c and 73c, with an embodiment of the invention positioned in each. The embodiment comprises a combination of sacrificial structures: A plurality of individual seal structures in addition to a network of cross hatch pattern strucutres. The design and fabrication process of individual seal structures are described in conjunction with FIG. 2B, and the design and fabrication process of the network of cross hatch pattern structures are described in conjunction with FIG. 5. The cross sections through the individual seal structures 104 look the same in FIG. 7B as they do in FIG. 7C, since these structures are basically walls of constant cross section, surrounding the complete perimeter of the circuit chip. In contrast, the cross section of the network structures look different in FIG. 7B (reference number 105) compared to FIG. 7C (reference number 106), since the metal lines of the grid will look continuous in cross section (FIG. 6 and FIG. 7C), when sectioned parallel to and within a metal line, but patterned, when sectioned at right angles with a metal line.

In order to highlight the flexibility of the embodiments of the invention, the network structures in the cross section of FIG. 7C are depicted as not anchored in diffused moats. This indicates that in this example the moat diffusion is constricted to a narrower area than displayed in the example of FIG. 5.

The sacrificial strucutures are manufactured as a group step by step as sequential depositions of insulators and metals, and as patterning steps of these layers, together with the fabrication of the integrated circuit elements. The fabrication follows generally the process steps described in conjunction with FIGS. 2A and 2B, and FIG. 5. Since the fabrication of the sacrificial structures completely follows the circuit manufacturing process, their fabrication adds no cost to that process.

The combination of sacrificial structures has to fit into the seal areas 72c and 73c of FIGS. 7B and 7C. Consequently, their geometrical dimensions have to be appropriately as small as the dimensions of circuit elements. For instance, the width of metal lines 76 is typically in the range between 1 and 3 $\mu$m, with a preferred width of 2 $\mu$m, the pitch between metal lines is commonly between 4 and 12 $\mu$m. The width of vias 77 falls in the 0.4 to 1.5 $\mu$m range. With this dense packing of the protective sacrificial structures, the width of the dicing line 75 can remain in the 70 to 80 $\mu$m range, comfortable for commercial sawing blades.

As can be seen from FIGS. 7B and 7C in combination with FIG. 7A, each set of sacrificial structures follows the respective longitudinal edges of the scribe lines in an approximately parallel manner. In addition, each set follows the respective data edges of the integrated circuit in an approximately parallel manner.

The greatest benefit of the crack-absorbing capability of the sacrificial structures is achieved when the three-dimensional network is positioned geometrically closest to the actual dicing cut, followed at least one sealing metal wall towards the data edge of the integrated circuit. This embodiment of the invention is shown in the cross sections of FIGS. 7B and 7C. Any nascent crack which started to penetrate the three-dimensional lattice of sacrificial metal strips, is losing energy by the debonding processes of the composite structures described above, and is generally splitting up into numerous weak microcracks. Not enough energy is left to disrupt the sealing walls. By applying electrical potential to the metal structures through the connection to the diffuded moat, become electrically active and act as seals to keep mobile ions out. They can also act as ground rings.

While this invention has been described in reference to illustrative embodiments, this description is not intended to be construed in a limiting sense. Various modifications and combinations of the illustrative embodiments, as well as other embodiments of the invention, will be apparent to persons skilled in the art upon reference to the description. It is, therefore, intended that the appended claims encompass any such modifications or embodiments.

What is claimed is:

1. A monocrystalline semiconductor wafer comprising:
   an array of integrated circuit chips bordered by dicing lines, at least two sets of substantially parallel structures within each of said dicing lines, each set extending along the edge of a chip on opposite sides of each dicing line, respectively; each of said sets comprising at least one continuous barrier walladjacent each chip, respectively, and a sacrificial composite structure in combination therewith, between said wall and the center of the dicing line, said composite structure including means for dispersing the energy associated with crack propagation, whereby any crack having sufficient energy to penetrate the composite structure will be transformed into a plurality of weaker cracks, none of which will be capable of penetrating said wall; said-means for dispensing the energy associated with crack propagation comprising at least two grids of intersecting metal lines, connected by metal-filled vias, thereby forming a three-dimensional network of metal distributed within a plurality of oxide insulation layers.o penetrate the composite structure will be transformed into a plurality of weaker cracks, none of which will be capable of penetrating said wall; said means for dispersing the energy associated with crack propagation comprising at least two grids of intersecting metal lines, connected by metal-filled vias, thereby forming a three-dimensional network of metal distributed within a plurality of oxide insulation layers.

* * * * *